US012740263B2

(12) United States Patent
Pu et al.

(10) Patent No.: US 12,740,263 B2

(45) Date of Patent: Sep. 15, 2026

(54) DISPLAY PANEL AND DISPLAY APPARATUS WITH A PLURALITY OF CONNECTING MEMBERS CONNECTED TO A SINGLE ANODE

(71) Applicants: YUNNAN INVENSIGHT OPTOELECTRONICS TECHNOLOGY CO., LTD., Kunming (CN); BOE TECHNOLOGY GROUP CO., LTD., Beijing (CN)

(72) Inventors: Chao Pu, Beijing (CN); Shengji Yang, Beijing (CN); Kuanta Huang, Beijing (CN); Pengcheng Lu, Beijing (CN); Xiaochuan Chen, Beijing (CN); Junbo Wei, Beijing (CN); Zhao Ma, Beijing (CN); Liuzeming Qu, Beijing (CN)

(73) Assignees: YUNNAN INVENSIGHT OPTOELECTRONICS TECHNOLOGY CO., LTD., Kunming (CN); BOE TECHNOLOGY GROUP CO., LTD., Beijing (CN)

( * ) Notice: Subject to any disclaimer, the term of this patent is extended or adjusted under 35 U.S.C. 154(b) by 546 days.

(21) Appl. No.: 18/261,753

(22) PCT Filed: Dec. 24, 2021

(86) PCT No.: PCT/CN2021/141376
§ 371 (c)(1),
(2) Date: Jul. 17, 2023

(87) PCT Pub. No.: WO2023/115581
PCT Pub. Date: Jun. 29, 2023

(65) Prior Publication Data

US 2024/0298486 A1 Sep. 5, 2024

(51) Int. Cl.
*H10K 59/131* (2023.01)
*H10K 59/80* (2023.01)

(52) U.S. Cl.
CPC ..... *H10K 59/131* (2023.02); *H10K 59/80521* (2023.02)

(58) Field of Classification Search
CPC ....................... H10K 59/131; H10K 59/80521
See application file for complete search history.

(56) References Cited

U.S. PATENT DOCUMENTS

| | | | | |
|---|---|---|---|---|
| 9,035,854 | B2 | 5/2015 | Lee et al. | |
| 2009/0058290 | A1* | 3/2009 | Matsuura ......... | H10K 59/80518 313/506 |

(Continued)

FOREIGN PATENT DOCUMENTS

| | | | |
|---|---|---|---|
| CN | 103872078 | A | 6/2014 |
| CN | 103928498 | A | 7/2014 |

(Continued)

OTHER PUBLICATIONS

European Application No. 21968710.0, Extended European Search Report, dated Dec. 6, 2024.

*Primary Examiner* — Lex H Malsawma
(74) *Attorney, Agent, or Firm* — DINSMORE & SHOHL LLP

(57) ABSTRACT

A display panel and a display apparatus. The display panel includes a backplane and light-emitting devices. The backplane includes: a base substrate; pixel driving circuits; a first insulating layer; conductive portions, wherein each of the conductive portions is connected to a corresponding pixel driving circuit via a first connector penetrating through the first insulating layer; and a second insulating layer located on the side of the first insulating layer and the conductive portions away from the base substrate. The light-emitting devices are located on the side of the second insulating layer (Continued)

away from the base substrate, wherein an anode of at least one of the light-emitting devices is connected to a corresponding conductive portion via second connectors penetrating through the second insulating layer.

19 Claims, 4 Drawing Sheets

(56) References Cited

U.S. PATENT DOCUMENTS

2009/0108743 A1* 4/2009 Kobayashi ......... H10K 59/8791 313/504
2010/0013383 A1* 1/2010 Kim ................. H10K 59/80517 345/206
2010/0051958 A1* 3/2010 Izumida ........... H10K 59/80522 257/E33.053
2014/0159002 A1 6/2014 Lee et al.
2016/0020422 A1* 1/2016 Kim ................. H10K 59/80522 257/40
2017/0250236 A1 8/2017 Xiong et al.
2017/0346036 A1 11/2017 Kim
2018/0175118 A1* 6/2018 Toyoda .................. H10K 59/35
2019/0280060 A1 9/2019 Liu et al.
2019/0319081 A1 10/2019 Kim et al.
2020/0212346 A1* 7/2020 Lee ...................... H10K 59/122
2020/0295104 A1 9/2020 Kim et al.
2021/0217980 A1 7/2021 Yang et al.
2022/0140277 A1* 5/2022 Yang ................ H10K 59/80521 257/40
2022/0271101 A1 8/2022 Bing
2022/0336778 A1* 10/2022 Kim ................. H10K 59/80518
2022/0376013 A1* 11/2022 Li ........................ H10K 59/123
2022/0416195 A1* 12/2022 Zhang .................. H10K 50/171
2023/0108752 A1 4/2023 Xu et al.
2023/0172023 A1 6/2023 Xu et al.

FOREIGN PATENT DOCUMENTS

CN 107452883 A 12/2017
CN 108231860 A 6/2018
CN 108321181 A 7/2018
CN 109148725 A 1/2019
CN 109216583 A 1/2019
CN 110993648 A 4/2020
CN 111524956 A 8/2020
CN 112071889 A 12/2020
CN 112366226 A 2/2021
CN 113410176 A 9/2021
CN 113571656 A 10/2021
CN 115623825 A 1/2023
EP 4131394 A1 2/2023
WO WO-2021189494 A1 * 9/2021 ........... H10K 59/131
WO WO-2021189495 A1 * 9/2021 ....... H10K 59/80522

* cited by examiner

Same column
201a
CM2
201b
201c
CM2
CM2
201d
CM2
Same row

DISPLAY PANEL AND DISPLAY APPARATUS WITH A PLURALITY OF CONNECTING MEMBERS CONNECTED TO A SINGLE ANODE

CROSS-REFERENCE TO RELATED APPLICATIONS

The present application is a U.S. National Stage Application under 35 U.S.C. § 371 of International Patent Application No. PCT/CN2021/141376, filed on Dec. 24, 2021, the disclosure of which is incorporated by reference herein in its entirety.

TECHNICAL FIELD

The present disclosure relates to a display panel and a display apparatus.

BACKGROUND

The silicon-based OLED (Organic Light-Emitting Diode) display apparatus, which has the advantages of high resolution, low power consumption, small volume, and small weight, presents application prospects in high-resolution near-to-eye display industries such as wearable device, industrial security, or health care.

SUMMARY

According to one aspect of the embodiments of the present disclosure, a display panel is provided. The display panel comprises: a backplane, comprising: a base substrate, a plurality of pixel driving circuits located on one side of the base substrate, a first insulating layer located on one side of the plurality of pixel driving circuits away from the base substrate, a plurality of conductive portions located on one side of the first insulating layer away from the base substrate, wherein each of the plurality of conductive portions is connected to a corresponding pixel driving circuit via a first connecting member penetrating through the first insulating layer, and a second insulating layer located on one side of the first insulating layer and the plurality of conductive portions away from the base substrate; and a plurality of light-emitting devices located on one side of the second insulating layer away from the base substrate, wherein an anode of at least one of the plurality of light-emitting devices is connected to a corresponding conductive portion via a plurality of second connecting members penetrating through the second insulating layer.

In some embodiments, at least one of the plurality of second connecting members comprises: a first portion located inside the second insulating layer; and a second portion located outside the second insulating layer and connected to the first portion, wherein the second portion is in contact with the anode.

In some embodiments, the second portion comprises: a third portion; and a fourth portion located on one side of the third portion away from the first portion and connected to the third portion, wherein an orthographic projection of the fourth portion on the base substrate is within an orthographic projection of the third portion on the base substrate.

In some embodiments, in a direction from the first portion to the second portion, an area of a section of the second portion parallel to a surface of the base substrate gradually decreases.

In some embodiments, the anode comprises a first anode portion and a second anode portion, the second anode portion comprises a third anode portion covering the first anode portion and a fourth anode portion in contact with the second insulating layer, and a minimum distance between a first edge of the fourth anode portion away from the first anode portion and a second edge of the fourth anode portion close to the first anode portion is greater than a height of the second portion.

In some embodiments, the height of the second portion ranges from 15 nm to 50 nm.

In some embodiments, in at least one section perpendicular to the base substrate, on a straight line passing through two adjacent second connecting members of the plurality of second connecting members, a distance between the two adjacent second connecting members on the straight line is greater than a distance between two anodes of two adjacent light-emitting devices of the plurality of light-emitting devices on the straight line.

In some embodiments, two cathodes of two adjacent light-emitting devices of the plurality of light-emitting devices comprise a first cathode and a second cathode, wherein the first cathode has a first protrusion portion close to the second cathode and a second protrusion portion away from the second cathode, and the second cathode has a third protrusion portion close to the first cathode and a fourth protrusion portion away from the first cathode; and a minimum distance between edges of two orthographic projections of two adjacent second connecting members of the plurality of second connecting members on the base substrate is smaller than a distance between the first protrusion portion and the third protrusion portion.

In some embodiments, a maximum distance between the edges of the two orthographic is smaller than the distance between the first protrusion portion and the third protrusion portion.

In some embodiments, each of the at least one of the plurality of light-emitting devices further comprises a cathode and a functional layer located between the anode and the cathode; and a maximum distance between edges of two orthographic projections of two adjacent second connecting members of the plurality of second connecting members on the base substrate is greater than a thickness of the functional layer.

In some embodiments, a line passing through two orthographic projections of two adjacent second connecting members of the plurality of second connecting members on the base substrate intersects with an edge of an orthogonal projection of the anode on the base substrate at a first point and a second point; and a minimum distance between each of the first point and the second point and edges of the two orthogonal projections is greater than ⅕ of a distance between the first point and the second point.

In some embodiments, an anode of one of any two adjacent light-emitting devices in a same row of the plurality of light-emitting devices is a first anode, and an anode of the other of the any two adjacent light-emitting devices in the same row is a second anode; and orthographic projections of the plurality of second connecting members connected to the first anode on the base substrate is centrally symmetrical with orthographic projections of the plurality of second connecting members connected to the second anode on the base substrate.

In some embodiments, an anode of one of any two light-emitting devices in a same column of the plurality of light-emitting devices is a third anode, and an anode of the other of the any two light-emitting devices in the same column is a fourth anode; first orthographic projections of the plurality of second connecting members connected to the third anode on the base substrate and a second orthographic projection of the third anode on the base substrate constitute a first pattern; and third orthographic projections of the plurality of second connecting members connected to the fourth anode on the base substrate and a fourth orthographic projection of the fourth anode on the base substrate constitute a second pattern, wherein the third orthographic projections completely overlap with the first orthographic projections in a case where the second pattern is moved so that the fourth orthographic projection completely overlaps with the second orthographic projection.

In some embodiments, a plurality of orthogonal projections of the plurality of second connecting members on the base substrate have a same shape.

In some embodiments, the same shape comprises a circle.

In some embodiments, a ratio of a minimum distance between two adjacent orthogonal projections of the plurality of orthogonal projections to a diameter of the circle ranges from 0.5 to 1.5.

In some embodiments, a ratio of a minimum distance between each of the plurality of orthogonal projections and an edge of an orthogonal projection of the corresponding conductive portion on the base substrate to a diameter of the circle ranges from 0.5 to 2.5.

In some embodiments, a diameter of the circle ranges from 200 nm to 300 nm.

In some embodiments, the plurality of conductive portions is connected to the plurality of pixel driving circuits in one-to-one correspondence; and a plurality of anodes of the plurality of light-emitting devices is connected to the plurality of conductive portions in one-to-one correspondence.

In some embodiments, the backplane is a silicon-based backplane.

According to another aspect of the embodiments of the present disclosure, a display apparatus is provided. The display apparatus comprises: the display panel according to any of the above embodiments.

BRIEF DESCRIPTION OF THE ACCOMPANYING DRAWINGS

The accompanying drawings which constitute a part of this specification, illustrate the embodiments of the present disclosure, and together with this specification, serve to explain the principles of the present disclosure.

The present disclosure may be more explicitly understood from the following detailed description with reference to the accompanying drawings, in which.

Figure 1:
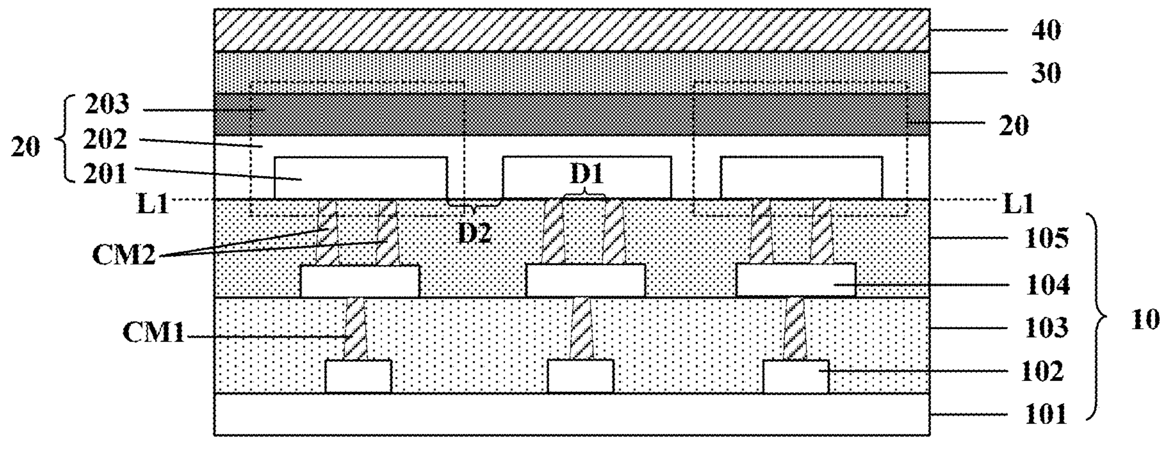
FIG. 1 is a schematic structural view showing a display panel according to an embodiment of the present disclosure.

It should be understood that the dimensions of various parts shown in the accompanying drawings are not necessarily drawn according to actual proportional relations. In addition, the same or similar components are denoted by the same or similar reference signs.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity, or importance, but are merely used to distinguish between different parts. A word such as "comprise", "have" or variants thereof means that the element before the word covers the element (s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

The inventors have noticed that the silicon-based OLED display panel in the related art produces an unstable display effect. The inventors have found through studies that the anode of each light-emitting device is connected to a corresponding pixel driving circuit in the backplane only via one connecting member. If the connection between the anode and the connecting member is unreliable, the light-emitting device will not be normally driven to emit light, thereby affecting the display effect of the display panel.

In view showing this, the embodiments of the present disclosure provide the following technical solutions.

FIG. 1 is a schematic structural view showing a display panel according to an embodiment of the present disclosure.

As shown in FIG. 1, the display panel comprises a backplane 10 and a plurality of light-emitting devices 20. The backplane 10 comprises a base substrate 101, a plurality of pixel driving circuits 102 located on one side of the base substrate 101, a first insulating layer 103, a plurality of conductive portions 104 and a second insulating layer 105.

In some embodiments, the backplane 10 is a silicon-based backplane 10. In this case, the base substrate 101 may be, for example, a silicon base substrate.

In some embodiments, the pixel driving circuit 102 may comprise two MOS (Metal Oxide Semiconductor) transistors and one capacitor (2T1C). However, the embodiments of the present disclosure are not limited to this, and in other embodiments, the pixel driving circuit 102 may also comprise more MOS transistors.

The first insulating layer 103 is located on one side of the plurality of pixel driving circuits 102 away from the base substrate 101. For example, the material of the first insulating layer 103 comprises an oxide of silicon or a nitride of silicon.

The plurality of conductive portions 104 is located on one side of the first insulating layer 103 away from the base substrate 101. Each conductive portion 104 is connected to a corresponding pixel driving circuit 102 via a first connecting member CM1 penetrating through the first insulating layer 103. In some embodiments, the plurality of conductive portions 104 is connected to the plurality of pixel driving circuits 102 in one-to-one correspondence.

In some embodiments, the material of each conductive portion 104 comprises metal. As some implementations, each conductive portion 104 comprises a first metal nitride layer, a second metal nitride layer, and an alloy layer located between the first metal nitride layer and the second metal nitride layer. For example, the materials of the first metal nitride layer and the second metal nitride layer comprise TiN. For example, the material of the alloy layer comprises aluminum-copper alloy (for example, AlCu).

As some implementations, the material of the first connecting member CM1 comprises a metal such as tungsten.

The second insulating layer 105 is located on one side of the first insulating layer 103 and the plurality of conductive portions 104 away from the base substrate 101. For example, the material of the second insulating layer 105 comprises an oxide of silicon or a nitride of silicon.

The plurality of light-emitting devices 20 is located on one side of the second insulating layer 105 away from the base substrate 101. Each light-emitting device 20 comprises an anode 201, a functional layer 202 located on one side of the anode 201 away from the base substrate 101, and a cathode 203 located on one side of the functional layer 202 away from the base substrate 101. Here, the functional layer 202 at least comprises a light-emitting layer, for example, an organic light-emitting layer. In some embodiments, the functional layer 202 further comprises one or more of an electron transport layer, an electron injection layer, a hole transport layer and a hole injection layer. In some embodiments, the functional layers 202 of the plurality of light-emitting devices 20 may be integrated. In some embodiments, the cathodes 203 of the plurality of light-emitting devices 20 may be integrated, that is, the plurality of light-emitting devices 20 shares one cathode 203.

The anode 201 of at least one light-emitting device 20 is connected to a corresponding conductive portion 104 via a plurality of second connecting members CM2 penetrating through the second insulating layer 105. In some embodiments, a plurality of anodes 201 of the plurality of light-emitting devices 20 is connected to the plurality of conductive portions 104 in one-to-one correspondence. In some embodiments, the anode 201 of each light-emitting device 20 is connected to a corresponding conductive portion 104 via a plurality of second connecting members CM2 penetrating through the second insulating layer 105.

As some implementations, the number of the plurality of second connecting members CM2 is two. As some implementations, the materials of the plurality of second connecting members CM2 comprise a metal such as tungsten.

It should be understood that the plurality of second connecting members CM2 connected to one anode 201 are spaced apart from each other. For example, in a case where the connection between the anode 201 and one second connecting member CM2 is unreliable, the connection between the anode 201 and another second connecting member CM2 may be reliable.

In the above embodiments, the anode 201 of at least one light-emitting device 20 is connected to a corresponding conductive portion 104 via a plurality of second connecting members CM2. In this way, the reliability of the connection between at least one anode 201 and the conductive portion 104 is improved, thereby improving the display effect of the display panel.

In some embodiments, referring to FIG. 1, the display panel further comprises an encapsulation layer 30 and a color filter layer 40. For example, the plurality of light-emitting devices 20 is configured to emit white light which will pass through the color film layer 40 to exhibit different colors, for example, red light, green light, or blue light.

The encapsulation layer 30 is located on one side of the plurality of light-emitting devices 20 away from the base substrate 101. In some embodiments, the encapsulation layer 30 comprises an inorganic layer located on one side of the cathode 203 away from the base substrate 101 and an organic layer located on one side of the inorganic layer away from the base substrate 101. For example, the material of the inorganic layer may comprise nitride of silicon, aluminum trioxide, or the like. For example, the material of the organic layer is parylene.

The color film layer 40 is located on one side of the encapsulation layer 30 away from the base substrate 101. In some embodiments, an adhesive layer, such as a glue layer, may be provided between the color film layer 40 and the encapsulation layer 30.

Figure 2A:
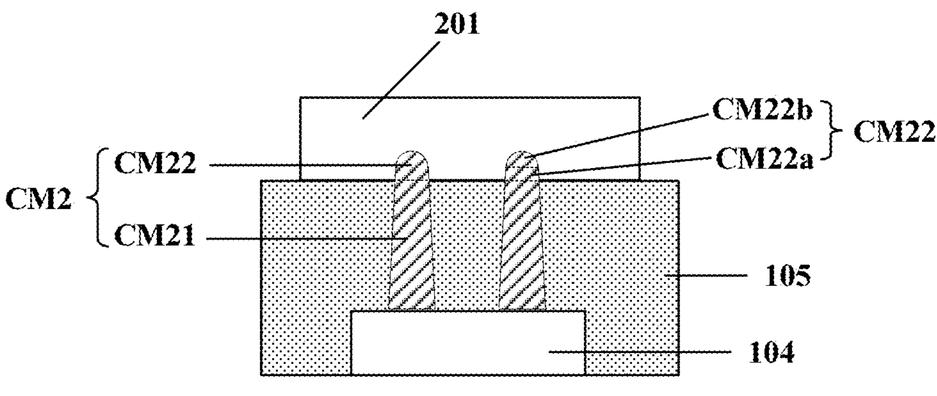
FIG. 2A is an enlarged schematic view showing the connection between an anode and a plurality of second connecting members according to an embodiment of the present disclosure.

FIG. 2A is an enlarged schematic view showing the connection between an anode and a plurality of second connecting members according to an embodiment of the present disclosure.

As shown in FIG. 2A, in some embodiments, at least one second connecting member CM2 of the plurality of second connecting members CM2 connected to one anode 201 comprises a first portion CM21 located inside the second insulating layer 105 and a second portion CM22 located outside the second insulating layer 105. Here, the second portion CM22 is connected to the first portion CM21, and the second portion CM22 is in contact with the anode 201. In some embodiments, each second connecting member CM2 comprises a second portion CM22 and a first portion CM21. In some embodiments, the surface of the second portion CM22 has a curvature which is not zero, that is, the surface is arc shaped.

It should be understood that for the purpose of description, the portion of the second connecting member CM2 located inside the second insulating layer 105 is referred to as the first portion CM21, and the portion of the second connecting member CM2 located outside the second insulating layer 105 is referred to as the second portion CM22, but this does not necessarily present that the second portion CM22 and the first portion CM21 are separated. For example, the second portion CM22 and the first portion CM21 may be integrally provided.

In the above embodiments, at least one second connecting member CM2 comprises the second portion CM22 protruding from the second insulating layer 105. In this way, a contact area between the second connecting member CM2 and the anode 201 is increased, which improves the reliability of the anode 201 and the second connecting member CM2, and further improves the reliability of the connection between the anode 201 and the conductive portion 104, thereby further improving the display effect of the display panel.

In some embodiments, in at least one section perpendicular to the base substrate 101, for example, in the section shown in FIG. 1, on a straight line L1 passing through two adjacent second connecting members CM2 of the plurality of second connecting members CM2, the distance D1 between the two adjacent second connecting members CM2 on the straight line L1 is greater than the distance D2 between two anodes 201 of two adjacent light-emitting devices 20 in the plurality of light-emitting devices 20. This is helpful to further improve the display effect of the display panel. As some implementations, the ratio r1 of D1 to D2 is greater than 1 and less than or equal to 1.2, for example, r1 is 1.1, 1.15, etc.

It should be understood that the straight line L1 also passes through two anodes 201 of two adjacent light-emitting devices 20. Here, FIG. 1 schematically shows the position of the straight line L1 to coincide with the upper surface of the second insulating layer 105. It can be understood that in the case where the second connecting member CM2 comprises the second portion CM22, the straight line L1 may pass through the second portion CM22.

The inventors have noticed that the height of the second portion CM22 would have an influence on the display effect of the display panel. In a case where the height of the second portion CM22 ranges from 15 nm to 50 nm (for example, 18 nm, 45 nm, 48 nm, 50 nm, etc.), the contact area between the second connecting member CM2 and the anode 201 is increased as much as possible, and the influence on the flatness of the anode 201 is reduced. In this way, on the basis of improving the display effect of the display panel, it is more helpful to reduce the thickness of the display panel.

In some embodiments, the height of the second portion CM22 ranges from 20 nm to 45 nm, for example, 25 nm, 30 nm, 35 nm, etc. In this way, on the basis of improving the display effect of the display panel, it is more helpful to reduce the thickness of the display panel.

In some embodiments, referring to FIG. 2, the second portion CM22 comprises a third portion CM22*a* and a fourth portion CM22*b*. Here, the fourth portion CM22*b* is located on one side of the third portion CM22*a* away from the first portion CM21 and the fourth portion CM22*b* is connected to the third portion CM22*a*. In addition, the orthographic projection of the fourth portion CM22*b* on the base substrate 101 is within the orthographic projection of the third portion CM22*a* on the base substrate 101. Such a structure is helpful to reduce the possibility that some regions of the anode 201 cannot be in contact with the second connecting member CM2, and further improve the reliability of the connection between the anode 201 and the conductive portion 104, thereby further improving the display effect of the display panel.

In some embodiments, in a direction from the first portion CM21 to the second portion CM22, the area of a section of the second portion CM22 parallel to the surface of the base substrate 101 gradually decreases. For example, the section of the second portion CM22 parallel to the surface of the base substrate 101 is a circle. The closer to the anode 201, the smaller the area of the circle is.

In this way, it is helpful to further reduce the possibility that some regions of the anode 201 cannot be in contact with the second connecting member CM2, and further improve the reliability of the connection between the anode and the conductive portion 104, thereby further improving the display effect of the display panel.

Figure 2B:
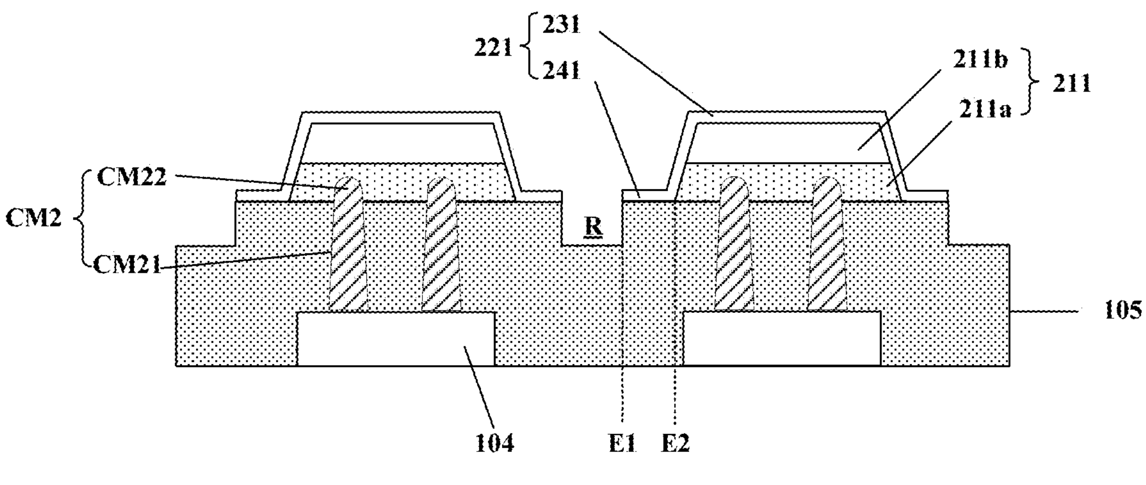
FIG. 2B is an enlarged schematic view showing the connection between an anode and a plurality of second connecting members according to another embodiment of the present disclosure.

FIG. 2B is an enlarged schematic view showing the connection between an anode and a plurality of second connectors according to another embodiment of the present disclosure.

As shown in FIG. 2B, in some embodiments, the anode 201 comprises a first anode portion 211 and a second anode portion 221. The second anode portion 221 comprises a third anode portion 231 covering the first anode portion 211 and a fourth anode portion 241 in contact with the second insulating layer 105. Here, the third anode portion 231 covers the upper surface and the side surfaces of the first anode portion 211, and the fourth anode portion 241 is connected to the third anode portion 231 and in contact with the second insulating layer 105.

The minimum distance between a first edge E1 of the fourth anode portion 241 away from the first anode portion 211 and a second edge E2 close to the first anode portion 211 is greater than the height of the second portion CM22. As some implementations, the ratio r2 of the minimum distance between the first edge E1 and the second edge E2 to the height of the second portion CM22 is greater than 1 and less than or equal to 1.2, for example, r2 is 1.1, 1.15, etc.

It is to be noted that the minimum distance between two edges herein can be understood as the minimum value among the distances between various points on one edge and various points on the other edge, and the maximum distance between two edges can be understood as the maximum value among the distances between various points on one edge and various points on the other edge. Similarly, the minimum distance between a point and an edge can be understood as the minimum value among the distances between this point and various points on this edge, and the maximum distance between a point and an edge can be understood as the maximum value among the distances between this point and various points on this edge.

In the above implementations, the height of the second portion CM22 is smaller than the minimum distance between the first edge E1 and the second edge E2. In this way, an adverse effect over an interface between the fourth conductive portion 241 and the second insulating layer 105 (for example, a slit appears) due to an excessively large height of the second portion CM22 is avoided, thereby reducing the adverse effect on the property of the anode 201.

As some implementations, referring to FIG. 2B, the first anode portion 211 comprises a first metal layer 211*a* and a second metal layer 211*b* located on one side of the first metal layer 211*a* away from the second insulating layer 105. For example, the material of the first metal layer 211*a* comprises titanium, and the material of the second metal layer 211*b* comprises aluminum. As some implementations, the material of the second anode portion 221 comprises indium tin oxide (ITO).

In some embodiments, the second insulating layer 105 has a recess R located between adjacent anodes 201. It should be understood that in the case where the second insulating layer 105 has a recess R, the first edge E1 is aligned with the side wall of the recess R.

Figures 2C, 3:
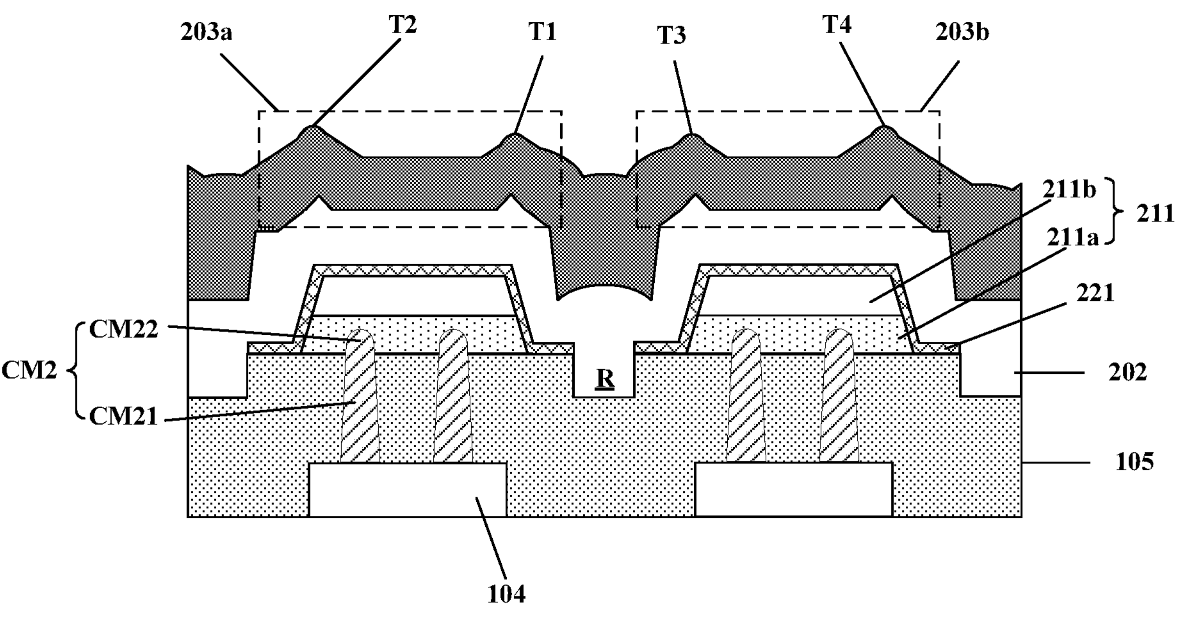
FIG. 2C is an enlarged schematic view showing the connection between an anode and a plurality of second connecting members according to a further embodiment of the present disclosure.
FIG. 3 is a schematic view showing projections of a plurality of anodes and a plurality of second connecting members of each anode according to an embodiment of the present disclosure.

FIG. 2C is an enlarged schematic view showing the connection between an anode and a plurality of second connectors according to a further embodiment of the present disclosure.

As shown in FIG. 2C, two cathodes of two adjacent light-emitting devices 20 in the plurality of light-emitting devices 20 comprise a first cathode 203*a* and a second cathode 203*b*. The first cathode 203*a* has a first protrusion portion T1 close to the second cathode 203*b* and a second protrusion portion T2 away from the second cathode 203*b*, and the second cathode 203*b* has a third protrusion portion T3 close to the first cathode 203*a* and a fourth protrusion portion T4 away from the first cathode.

FIG. 3 is a schematic view showing projections of a plurality of anodes and a plurality of second connecting members of each anode according to an embodiment of the present disclosure.

As shown in FIG. 3, the anode 201 of one light-emitting device 20 of any two adjacent light-emitting devices 20 in a same row of the plurality of light-emitting devices 20 is a first anode 201*a*, and the anode 201 of the other light-emitting device 20 of any two adjacent light-emitting devices 20 in a same row of the plurality of light-emitting devices 20 is a second anode 201*b*.

In some embodiments, the orthographic projections of the plurality of second connecting members CM2 connected to the first anode 201*a* on the base substrate 101 is centrally symmetrical with the orthographic projections of the plurality of second connecting members CM2 connected to the second anode 201*b* on the base substrate 101. If the plurality of second connecting members CM2 connected to each anode 201 are regarded as a group of second connecting members, for a same row of light-emitting devices 20, the orthographic projections of two adjacent groups of second connecting members CM2 on the base substrate 101 are centrally symmetric.

Such a structure is helpful to make the plurality of pixel driving circuits 102 more compact, thereby making better use of space and improving the resolution of the display panel.

As shown in FIG. 3, the anode 201 of one light-emitting device 20 of any two light-emitting devices 20 in a same column of the plurality of light-emitting devices 20 is a third anode 201*c*, and the anode 201 of the other light-emitting device 20 of any two light-emitting devices 20 in a same column of the plurality of light-emitting devices 20 is a fourth anode 201*d*. Here, the first orthographic projections of a plurality of second connecting members CM2 connected to the third anode 201*c* on the base substrate 101 and the second orthographic projection of the third anode 201*c* on the base substrate 101 constitute a first pattern, and the third orthographic projections of a plurality of second connecting members CM2 connected to the fourth anode 201*d* on the base substrate 101 and the fourth orthographic projection of the fourth anode 201*d* on the base substrate 101 constitutes a second pattern. When the second pattern is moved so that the fourth orthographic projection completely overlaps with the second orthographic projection, the third orthographic projections also completely overlap with the first orthographic projections. In other words, in a case where the third orthographic projections and the fourth orthographic projection are moved together as a whole, if the fourth orthographic projection completely overlaps with the second orthographic projection, the third orthographic projections also completely overlap with the first orthographic projections.

In some embodiments, the orthographic projections of the plurality of second connecting members CM2 connected to the first anode 201*a* on the base substrate 101 is centrally symmetrical with the orthographic projections of the plurality of second connecting members CM2 connected to the second anode 201*b* on the base substrate 101, and in the case where the second pattern is moved so that the fourth orthographic projection completely overlaps with the second orthographic projection, the third orthographic projections completely overlaps with the first orthographic projections.

In this way, it is more helpful to make the plurality of pixel driving circuits 102 more compact, thereby making better use of the space and further improving the resolution of the display panel.

Figure 4A:
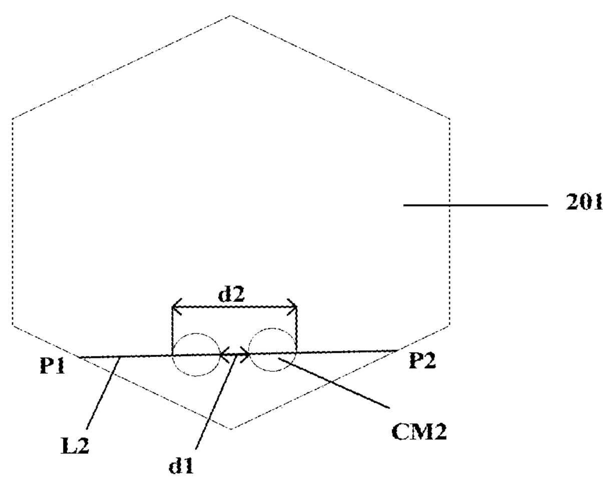
FIG. 4A is a schematic view showing projections of a plurality of second connecting members of an anode according to an embodiment of the present disclosure.

FIG. 4A is a schematic view showing projections of a plurality of second connecting members of an anode according to an embodiment of the present disclosure.

As shown in FIG. 4A, the minimum distance between edges of two adjacent second connecting members CM2 among the plurality of second connecting members CM2 on the base substrate 101 is d1 (hereinafter referred to as the minimum distance d1), and the maximum distance between edges of two adjacent second connecting members CM2 on the base substrate 101 is d2 (hereinafter referred to as the maximum distance d2).

The inventors have noticed that by adjusting the minimum distance d1 and the maximum distance d2, and the relationship with other components thereof, it is more conductive to improving the display effect of the display panel. Description will be made below in conjunction with different embodiments.

In some embodiments, referring to FIGS. 4A and 1, the maximum distance d2 is greater than the thickness of the functional layer 202 above the anode 201 corresponding to the plurality of second connecting members CM2. As some implementations, the ratio r3 of the maximum distance d2 to the thickness of the functional layer 202 is greater than 1 and less than or equal to 1.2. For example, r3 is 1.1, 1.15, etc.

In some embodiments, referring to FIGS. 4A and 2C, the minimum distance d1 is smaller than the distance between the first protrusion portion T1 and the third protrusion portion T3. In other embodiments, the minimum distance d1 is smaller than the distance between the first protrusion portion T1 and the third protrusion portion T3, and the maximum distance d2 is smaller than the distance between the first protrusion portion T1 and the third protrusion portion T3. As some implementations, the ratio r4 of the distance between the first protrusion portion T1 and the third protrusion portion T3 to the minimum distance d1 is greater than 1 and less than or equal to 1.2. As some implementations, the ratio r5 of the distance between the first protrusion portion T1 and the third protrusion portion T3 to the maximum distance d2 is greater than 1 and less than or equal to 1.2. For example, r4 and r5 are 1.1, 1.15, etc.

In some embodiments, a line L2 passing through the geometric centers (for example, the center of a circle) of two orthogonal projections of two adjacent second connecting members CM2 in the plurality of second connecting members CM2 on the base substrate 101 intersects with the edge of the orthogonal projection of the anode 201 on the base substrate 101 at a first point P1 and a second point P2. The minimum distance between each of the first point P1 and the second point P2 and the edges of the two orthogonal projections is greater than ⅕ of the distance between the first point P1 and the second point P2.

It should be understood that the above different embodiments can be combined to further improve the display effect of the display panel.

Figure 4B:
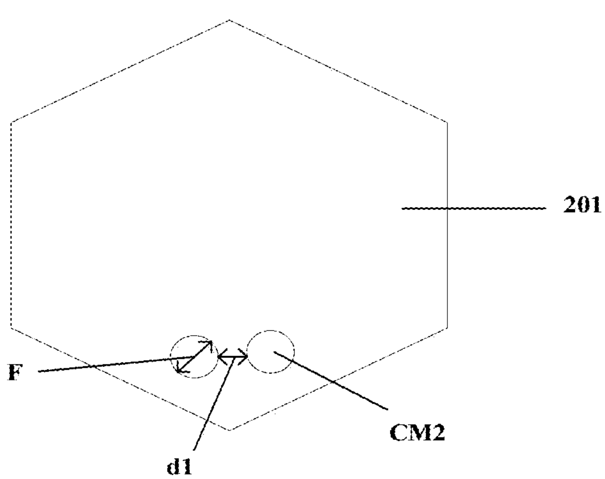
FIG. 4B is a schematic view showing projections of a plurality of second connecting members of an anode according to another embodiment of the present disclosure.

FIG. 4B is a schematic view showing projections of a plurality of second connecting members of an anode according to another embodiment of the present disclosure.

As shown in FIG. 4B, in some embodiments, a plurality of orthogonal projections of the plurality of second connecting members CM2 on the base substrate 101 have a same shape. For example, the shape of the orthographic projection of the second connecting member CM2 on the base substrate 101 comprises a circle. In some embodiments, the diameter F of the circle ranges from 200 nm to 300 nm, for example, 230 nm, 250 nm, 280 nm, etc.

In some embodiments, the ratio r6 of the minimum distance d1 between two adjacent orthogonal projections among a plurality of orthogonal projections of the plurality of second connecting members CM2 on the base substrate 101 to the diameter F of the circle ranges from 0.5 to 1.5. For example, r6 is 0.6, 1, 1.3, etc. When the ratio of d1 to F is within the above range, an unexpected connection between adjacent second connecting members CM2 due to an excessively small distance between adjacent second connecting members CM2 is avoided, and a reduced resolution of the display panel due to an excessively large distance between adjacent second connecting members CM2 is also avoided. In this way, the resolution and display effect of the display panel can be balanced at the same time.

In some embodiments, r6 ranges from 0.8 to 1.2. For example, r6 is 0.9, 1.1, etc. When the ratio of d1 to F is within the above range, an unexpected connection between adjacent second connecting members CM2 due to an excessively small distance between adjacent second connecting members CM2 is more effectively avoided, and a reduced resolution of the display panel due to an excessively large distance between adjacent second connecting members CM2 is also more effectively avoided. In this way, the resolution and display effect of the display panel can be better balanced at the same time.

Figure 5:
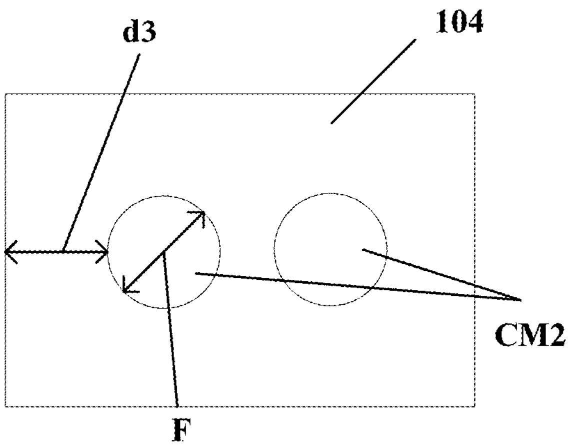
FIG. 5 is a schematic view showing projections of a plurality of second connecting members and a conductive portion according to an embodiment of the present disclosure.

FIG. 5 is a schematic view showing projections of a plurality of second connecting members and a conductive portion according to an embodiment of the present disclosure.

As shown in FIG. 5, the ratio r7 of the minimum distance d3 between each of the plurality of orthogonal projections of the plurality of second connecting members CM2 on the base substrate 101 and the edge of the orthogonal projection of the conductive portion 104 on the base substrate 101 to the diameter F of the circle ranges from 0.5 to 2.5. For example, the ratio of d3 to F is 0.8, 2.2, etc.

When the ratio of d3 to F is within the above range, on one hand, it is helpful to avoid the collapse of the second connecting member CM2 to ensure the reliability of the second connecting member CM2, thereby improving the display effect of the display panel; on the other hand, it is also helpful to improve the resolution of the display panel.

In some embodiments, r7 ranges from 1 to 2, for example, 1.2, 1.5, 1.8, etc. In this way, on one hand, it is more helpful to avoid the collapse of the second connecting member CM2 to ensure the reliability of the second connecting member CM2 more effectively, thereby further improving the display effect of the display panel; on the other hand, it is also more helpful to improve the resolution of the display panel.

Figure 6:
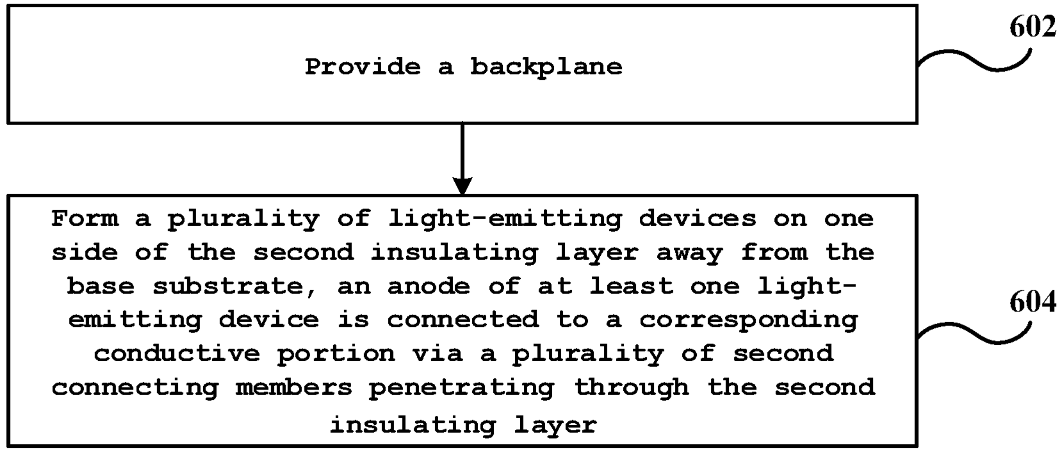
FIG. 6 is a flowchart showing a manufacturing method of a display panel according to an embodiment of the present disclosure.

FIG. 6 is a flowchart showing a manufacturing method of a display panel according to an embodiment of the present disclosure.

At step 602, a backplane is provided.

Here, the backplane comprises a base substrate, a plurality of pixel driving circuits located on one side of the base substrate, a first insulating layer located on one side of the plurality of pixel driving circuits away from the base substrate, a plurality of conductive portions located on one side of the first insulating layer away from the base substrate, and a second insulating layer located on one side of the first insulating layer and the plurality of conductive portions away from the base substrate. Each of the plurality of conductive portions is connected to a corresponding pixel driving circuit via a first connecting member penetrating through the first insulating layer.

For example, the backplane may be a silicon-based backplane. In some embodiments, the backplane may be formed by a MOS process.

At step 604, a plurality of light-emitting devices is formed on one side of the second insulating layer away from the base substrate.

Here, the anode of at least one light-emitting device is connected to a corresponding conductive portion via a plurality of second connecting members penetrating through the second insulating layer.

In the above embodiments, the formed anode of at least one light-emitting device is connected to a corresponding conductive portion via a plurality of second connecting members. In this way, the reliability of the connection between at least one anode and the conductive portion is improved, thereby improving the display effect of the display panel.

The present disclosure also provides a display apparatus, which may comprise the display panel according to any of the above embodiments. In some embodiments, the display apparatus may be any product or member having a display function, such as a wearable device, a mobile terminal, a television, a display, a notebook computer, a digital photo frame, a navigator, or an electronic paper.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. A display panel, comprising:
a backplane, comprising:
a base substrate,
a plurality of pixel driving circuits located on one side of the base substrate,
a first insulating layer located on one side of the plurality of pixel driving circuits away from the base substrate,
a plurality of conductive portions located on one side of the first insulating layer away from the base substrate, wherein each of the plurality of conductive portions is connected to a corresponding pixel driving circuit via a first connecting member penetrating through the first insulating layer, and
a second insulating layer located on one side of the first insulating layer and the plurality of conductive portions away from the base substrate; and
a plurality of light-emitting devices located on one side of the second insulating layer away from the base substrate, wherein an anode of at least one of the plurality of light-emitting devices is connected to a corresponding conductive portion via a plurality of second connecting members penetrating through the second insulating layer,
wherein at least one second connecting member of the plurality of second connecting members comprises:
a first portion located inside the second insulating layer; and
a second portion located outside the second insulating layer and connected to the first portion,
wherein the anode comprises a first anode portion, the first anode portion comprising a first metal layer in contact with the second portion, and a material of the at least one second connecting member being different from a material of the first metal layer.

2. The display panel according to claim 1, wherein the second portion comprises:
a third portion; and
a fourth portion located on one side of the third portion away from the first portion and connected to the third portion, wherein an orthographic projection of the fourth portion on the base substrate is within an orthographic projection of the third portion on the base substrate.

3. The display panel according to claim 2, wherein in a direction from the first portion to the second portion, an area of a section of the second portion parallel to a surface of the base substrate gradually decreases.

4. The display panel according to claim 1, wherein the anode further comprises a second anode portion, the second anode portion comprises a third anode portion covering the first anode portion and a fourth anode portion in contact with the second insulating layer, and a minimum distance between a first edge of the fourth anode portion away from the first anode portion and a second edge of the fourth anode portion close to the first anode portion is greater than a height of the second portion.

5. The display panel according to claim 1, wherein the height of the second portion ranges from 15 nm to 50 nm.

6. The display panel according to claim 1, wherein in at least one section perpendicular to the base substrate, on a straight line passing through two adjacent second connecting members of the plurality of second connecting members, a distance between the two adjacent second connecting members on the straight line is greater than a distance between two anodes of two adjacent light-emitting devices of the plurality of light-emitting devices on the straight line.

7. The display panel according to claim 1, wherein:
two cathodes of two adjacent light-emitting devices of the plurality of light-emitting devices comprise a first cathode and a second cathode, wherein the first cathode has a first protrusion portion close to the second cathode and a second protrusion portion away from the second cathode, and the second cathode has a third protrusion portion close to the first cathode and a fourth protrusion portion away from the first cathode; and
a minimum distance between edges of two orthographic projections of two adjacent second connecting members of the plurality of second connecting members on the base substrate is smaller than a distance between the first protrusion portion and the third protrusion portion.

8. The display panel according to claim 7, wherein a maximum distance between the edges of the two orthographic projections is smaller than the distance between the first protrusion portion and the third protrusion portion.

9. The display panel according to claim 1, wherein:
each of the at least one of the plurality of light-emitting devices further comprises a cathode and a functional layer located between the anode and the cathode; and
a maximum distance between edges of two orthographic projections of two adjacent second connecting members of the plurality of second connecting members on the base substrate is greater than a thickness of the functional layer.

10. The display panel according to claim 1, wherein:
a line passing through two orthographic projections of two adjacent second connecting members of the plurality of second connecting members on the base substrate intersects with an edge of an orthogonal projection of the anode on the base substrate at a first point and a second point; and
a minimum distance between each of the first point and the second point and edges of the two orthogonal projections is greater than 1/5 of a distance between the first point and the second point.

11. The display panel according to claim 1, wherein:
an anode of one of any two adjacent light-emitting devices in a same row of the plurality of light-emitting devices is a first anode, and an anode of the other of the any two adjacent light-emitting devices in the same row is a second anode; and
orthographic projections of the plurality of second connecting members connected to the first anode on the base substrate is centrally symmetrical with orthographic projections of the plurality of second connecting members connected to the second anode on the base substrate.

12. The display panel according to claim 11, wherein:
an anode of one of any two light-emitting devices in a same column of the plurality of light-emitting devices is a third anode, and an anode of the other of the any two light-emitting devices in the same column is a fourth anode;

first orthographic projections of the plurality of second connecting members connected to the third anode on the base substrate and a second orthographic projection of the third anode on the base substrate constitute a first pattern; and third orthographic projections of the plurality of second connecting members connected to the fourth anode on the base substrate and a fourth orthographic projection of the fourth anode on the base substrate constitute a second pattern, wherein the third orthographic projections completely overlap with the first orthographic projections in a case where the second pattern is moved so that the fourth orthographic projection completely overlaps with the second orthographic projection.

13. The display panel according to claim 1, wherein a plurality of orthogonal projections of the plurality of second connecting members on the base substrate have a same shape.

14. The display panel of claim 13, wherein the same shape comprises a circle.

15. The display panel according to claim 14, wherein a ratio of a minimum distance between two adjacent orthogonal projections of the plurality of orthogonal projections to a diameter of the circle ranges from 0.5 to 1.5.

16. The display panel according to claim 14, wherein a ratio of a minimum distance between each of the plurality of orthogonal projections and an edge of an orthogonal projection of the corresponding conductive portion on the base substrate to a diameter of the circle ranges from 0.5 to 2.5.

17. The display panel according to claim 14, wherein a diameter of the circle ranges from 200 nm to 300 nm.

18. The display panel according to claim 1, wherein:

the plurality of conductive portions is connected to the plurality of pixel driving circuits in one-to-one correspondence;

a plurality of anodes of the plurality of light-emitting devices is connected to the plurality of conductive portions in one-to-one correspondence; and the backplane is a silicon-based backplane.

19. A display apparatus, comprising the display panel according to claim 1.

* * * * *